United States Patent
Rocca

(10) Patent No.: US 10,433,069 B2
(45) Date of Patent: *Oct. 1, 2019

(54) CHARGE PUMP ASSEMBLY

(71) Applicant: TDK Corporation, Tokyo (JP)

(72) Inventor: Gino Rocca, Copenhagen (DK)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/554,398

(22) PCT Filed: Mar. 24, 2015

(86) PCT No.: PCT/EP2015/056249
§ 371 (c)(1),
(2) Date: Aug. 29, 2017

(87) PCT Pub. No.: WO2016/150486
PCT Pub. Date: Sep. 29, 2016

(65) Prior Publication Data
US 2018/0048965 A1    Feb. 15, 2018

(51) Int. Cl.
*H04R 19/01* (2006.01)
*H03F 1/30* (2006.01)

(52) U.S. Cl.
CPC .............. *H04R 19/016* (2013.01); *H03F 1/30* (2013.01); *H03F 2200/468* (2013.01)

(58) Field of Classification Search
CPC ........ H04R 19/04; H04R 3/00; H04R 19/005; H04R 2201/003; B81B 7/0087; B81B 2201/0257; B81B 2207/012

USPC .................................................. 381/113, 107
See application file for complete search history.

(56) References Cited

U.S. PATENT DOCUMENTS

| 5,961,215 | A | 10/1999 | Lee et al. | |
|---|---|---|---|---|
| 9,123,611 | B1* | 9/2015 | McKisson | G01J 1/00 |
| 2010/0175612 | A1 | 7/2010 | Narushima | |
| 2010/0301832 | A1* | 12/2010 | Katyal | G05F 3/30 |
| | | | | 323/314 |
| 2011/0018616 | A1* | 1/2011 | Li | H02M 3/073 |
| | | | | 327/536 |
| 2011/0234293 | A1* | 9/2011 | Shanan | H03B 19/00 |
| | | | | 327/361 |

(Continued)

FOREIGN PATENT DOCUMENTS

| CN | 101496108 A | 7/2009 |
|---|---|---|
| CN | 102594260 A | 7/2012 |

(Continued)

OTHER PUBLICATIONS

PCT Search Report corresponding to co-pending PCT Patent Appication No. PCT/EP2015/056249, European Patent Office, dated Dec. 4, 2015; (4 pages).

(Continued)

*Primary Examiner* — William A Jerez Lora
(74) *Attorney, Agent, or Firm* — Nixon Peabody LLP

(57) ABSTRACT

A charge pump assembly allowing MEMS microphones being temperature-compensated in a large temperature range and corresponding microphones are provided. An assembly includes a charge pump and a bias circuit electrically connected to the charge pump. A bias voltage provided by the bias circuit has a temperature dependence.

15 Claims, 5 Drawing Sheets

(56) References Cited

U.S. PATENT DOCUMENTS

Figure 1:
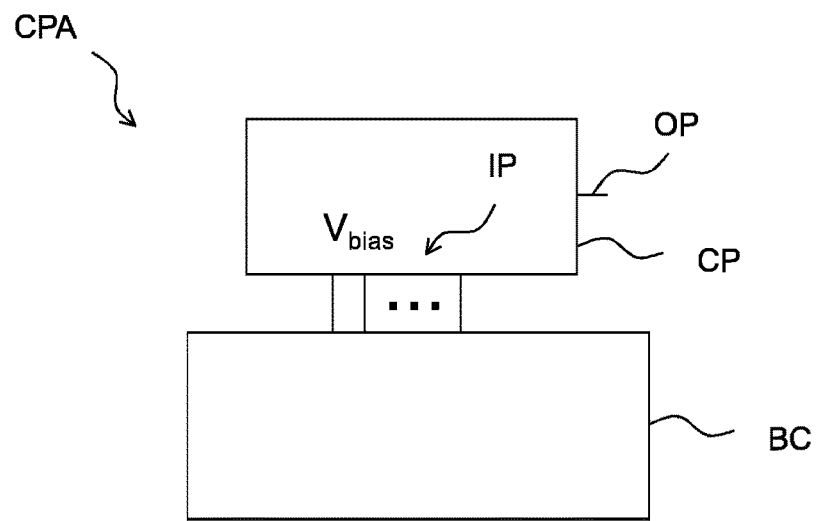

| | | | | |
|---|---|---|---|---|
| 2011/0285464 | A1* | 11/2011 | Montalvo | H03F 1/223 |
| | | | | 330/253 |
| 2014/0132313 | A1* | 5/2014 | Ding | H03B 19/00 |
| | | | | 327/119 |
| 2015/0333736 | A1* | 11/2015 | Wu | H03K 3/011 |
| | | | | 327/291 |
| 2015/0348905 | A1* | 12/2015 | Tsai | H01L 21/76898 |
| | | | | 257/774 |
| 2016/0111954 | A1* | 4/2016 | Bach | H04R 3/00 |
| | | | | 381/113 |
| 2016/0175612 | A1* | 6/2016 | Kazic | A61N 5/0624 |
| | | | | 606/3 |

FOREIGN PATENT DOCUMENTS

| | | |
|---|---|---|
| CN | 102804807 A | 11/2012 |
| JP | 2007-259545 A | 10/2007 |
| JP | 2008-125265 A | 5/2008 |
| WO | 2008/014033 A2 | 1/2008 |
| WO | 2011/001195 A1 | 1/2011 |

OTHER PUBLICATIONS

PCT Written Opinion corresponding to co-pending PCT Patent Application No. PCT/EP2015/056249, European Patent Office, dated Dec. 4, 2015; (6 pages).
International Search Report in International Patent Application No. PCT/EP2015/056249, dated Apr. 12, 2015 (4 pages).
Written Opinion in International Patent Application No. PCT/EP2015/056249, dated Apr. 12, 2015 (6 pages).

\* cited by examiner

CHARGE PUMP ASSEMBLY

CROSS-REFERENCE TO RELATED APPLICATIONS

This application is a U.S. National Stage of International Application No. PCT/EP2015/056249, filed Mar. 24, 2015, which is incorporated herein by reference in its entirety.

The present invention refers to charge pumps, e.g. charge pumps for MEMS microphones (MEMS=microelectromechanical system) having an improved sensitivity, especially over a large operation temperature range.

A MEMS microphone comprises mechanical components such as a MEMS capacitor with a variable capacitance and the microphones housing elements. Further, the microphone has electric or electronic components such as an ASIC (application specific integrated circuit) for charging the capacitor and evaluating the capacitor's capacitance.

It can be observed that the sensitivity of a MEMS microphone depends on the microphones operation temperature. In particular, the sensitivity of a MEMS microphone decreases with increasing temperature.

The contribution of a MEMS microphone's electrical and mechanical components to the temperature induced decrease in sensitivity is complex as the housing elements, the capacitor and the ASIC show temperature dependent properties.

However, a microphone with good electrical and acoustical properties is generally wanted and needed for modern devices. Thus, what is needed is a MEMS microphone with a constant high level of sensitivity independent from the operation temperature.

From WO 2011/001195 A1 temperature compensated microphones with temperature dependent amplifier gains are known.

From U.S. Pat. No. 7,889,030 MEMS microphones with reduced temperature coefficients of a chip comprising the capacitor are known.

From US 2011/0200212 microphones with temperature compensated charge pumps are known.

Although known microphones with improved components exist MEMS microphones with a constant sensitivity level over a large temperature region are still needed.

Thus, it is an object of the invention to provide a charge pump assembly that allows MEMS microphones to have a constant and high level of sensitivity over a large temperature range.

The charge pump assembly comprises a charge pump with an input port and an output port. The assembly further comprises a bias circuit. The bias circuit is electrically connected to the input port of the charge pump and provided for creating a bias voltage. The bias voltage has a temperature dependence.

The charge pump may be used to charge a MEMS capacitor of a MEMS microphone.

The bias voltage is a control voltage of the charge pump. A higher bias voltage applied to the input port of the charge pump may result in a larger amount of electrical charge stored in a microphone's capacitor.

As stated above, the sensitivity of a MEMS microphone depends at least partially on the temperature of the capacitor. It was found that by transferring a temperature dependent amount of charge to the MEMS capacitor not only the capacitor's contribution to the temperature induced deterioration can be reduced. Even the temperature induced deterioration of the microphone as a whole can be reduced or even eliminated by a properly designed charge pump assembly. Thus, a temperature compensated MEMS microphone working with a high level of temperature independent sensitivity can be constructed.

As stated above each of the different components of a MEMS microphone contributes to the microphone's temperature induced deterioration of sensitivity. Although an increase in voltage applied to the microphones capacitor generally increases the capacitor's—and thus the microphone's—sensitivity, the exact voltage for a temperature compensation over a large temperature range is difficult to determine and still more difficult to apply with conventional charge pump assemblies.

To obtain a temperature compensation that fulfills even strict requirements with a simple to implement bias circuit it is possible that the bias voltage applied to the charge pump has a piecewise linear temperature dependence. That is for a plurality of temperature intervals the slope of the temperature dependent bias voltage is constant. A higher number of temperature intervals results in a better temperature compensation. In the context of the present invention a circuit topology for the charge pump assembly was found that does not lead to a higher circuit complexity if a high number of temperature intervals are chosen to obtain an excellent temperature compensation.

It is possible that the charge pump assembly comprises a temperature sensor. The temperature sensor may provide a PTAT voltage (PTAT=proportional to absolute temperature). That is that the temperature sensor may provide a voltage that is proportional to the absolute temperature in Kelvin with k being a constant of proportionality:

$$V_{PTAT}[V] = k\left[\frac{V}{K}\right] * T[K] \tag{1}$$

It is possible that the bias circuit comprises a first sub circuit providing a plurality of different temperature independent voltages.

It is further possible that the bias circuit comprises a second sub circuit providing a plurality of temperature dependent voltages, each temperature dependent voltage having a different temperature dependency.

The first sub circuit may also comprise a plurality of voltage outputs. The number of voltage outputs of the first sub circuit may equal the number of voltage outputs of the second sub circuit and the number of voltage inputs of the charge pump. Each output the first sub circuit provides a voltage: $a_i + \alpha_i * T_i$ with $T_i$ being a predetermined temperature—or a physical quantity proportional to temperature—, i being the index number of the voltage output and $a_i$ and $\alpha_i$ being constant numbers. $a_i + \alpha_i * T_i$ is a temperature independent voltage.

The second sub circuit may comprise a plurality of voltage outputs. Each output the first sub circuit provides a voltage: $a_i + \alpha_i * T_i$ with being the temperature—or a physical quantity proportional to the temperature—, i being the index number of the voltage output and $a_i$ and $\alpha_i$ being constant numbers. $\alpha_i$ determines the slope of the temperature dependence of the respective output voltage.

The different threshold voltages $T_i$ for i=1, 2, . . . , N determine the boundaries of adjacent temperature intervals.

It is possible that the charge assembly comprises a plurality of selection circuits such as comparators. The number of selection circuits may equal the number of voltage outputs of the first sub circuit.

Each selection circuit is connected with one of the voltage outputs of the first sub section, of the second sub section and with one of the inputs of the charge pump. Each selection circuit may be further connected to the temperature sensor to receive a temperature signal.

Then it is possible that each selection circuit provides the voltage:

$$V_i = \begin{cases} a_i + \alpha_i * T: & T < T_i \\ a_i + \alpha_i * T_i: & T \geq T_i \end{cases} \quad (2)$$

to the corresponding charge pump's input.

I.e. a temperature dependent voltage if the actual operating temperature is below the threshold temperature $T_i$ and a constant temperature if the actual operating temperature equals or exceeds the threshold temperature $T_i$.

Thus, the charge pump is provided with a plurality of individual voltages. The number of temperature dependent partial voltages decreases with increasing temperature.

The charge pump may add the plurality of single voltages received at the inputs and transfer a charge corresponding to the sum $$V_{Bias} = V_1 + V_2 + \ldots + V_N \quad (3)$$

to a MEMS capacitor.

The voltage applied to the MEMS capacitor may be reduced or increased by an additional offset voltage created by a section of an ASIC $$V_{MEMS} = V_{Bias} - V_0 \quad (4)$$

The number of circuit elements of the charge pump assembly scales linearly with the number of temperature intervals without increasing the circuit's complexity.

It is possible that the charge pump assembly further comprises a non-volatile memory element for storing linearity parameters.

The linearity parameters are contained in the parameters $\alpha_i$. Further the parameters $a_i$ and the parameters $\alpha_i$ determine the temperature dependent charge transferred to the capacitor.

The parameters $a_i$ and $\alpha_i$ can be chosen to counteract the temperature dependence of the sensitivity of the MEMS microphone as a whole. That is a designer of a microphone does not need to study the temperature behavior of the single components and the complex interaction. Instead, the designer needs only to measure the temperature dependent deterioration of the whole component, chose the values for $a_i$ and $\alpha_i$ and store them in the memory element.

It was found that obtaining the optimal values for $a_i$ and $\alpha_i$ is straightforward as the temperature dependent sensitivity can be divided into the same temperature intervals, approximated by a piecewise linear curve and as the slope of the piecewise linear approximation of the sensitivity unambiguously corresponds to $a_i$ and $\alpha_i$ because the sensitivity increases linearly with the capacitor's voltage.

Accordingly the charge pump assembly can be integrated in and part of a MEMS microphone. Then, the microphone further comprises the MEMS capacitor to be charged by the charge pump assembly. The capacitor has a variable capacitance. Received sound signals result in a variation on capacitance. By evaluating the varying capacitance, e.g. by an ASIC, the sound signal can be transformed into an electrical signal.

A method for manufacturing a charge pump assembly or a microphone comprising the charge pump assembly comprises the steps of
    providing the mechanical and electrical components,
    electrically connecting the electrical components,
    determining the temperature dependent deterioration of the sensitivity,
    dividing the temperature range into intervals and approximating the sensitivity curve into a piecewise linear curve,
    determining the slopes of the piecewise linear sections,
    transforming the slopes into parameters $a_i$, $\alpha_i$.

The working principles and not limiting embodiments are described in the accompanying drawings.

IN THE DRAWINGS

Figure 2:
Figure 3:
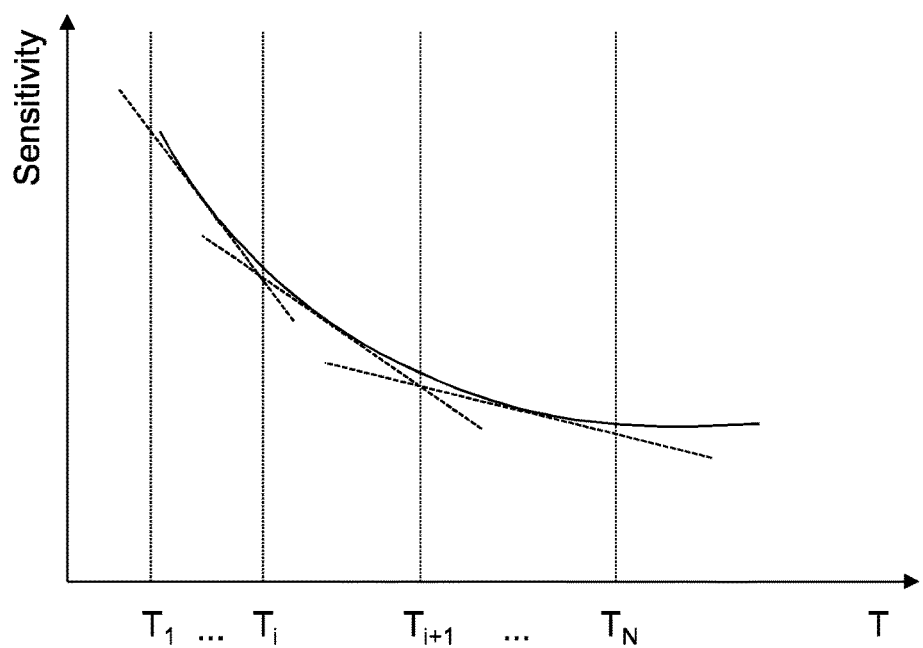
Figure 4:
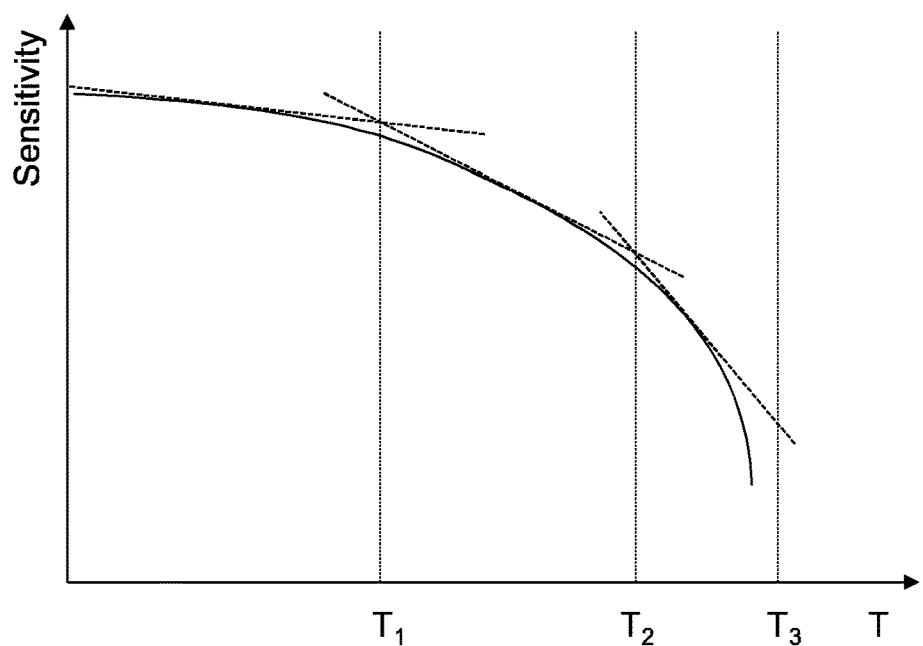
Figure 5:
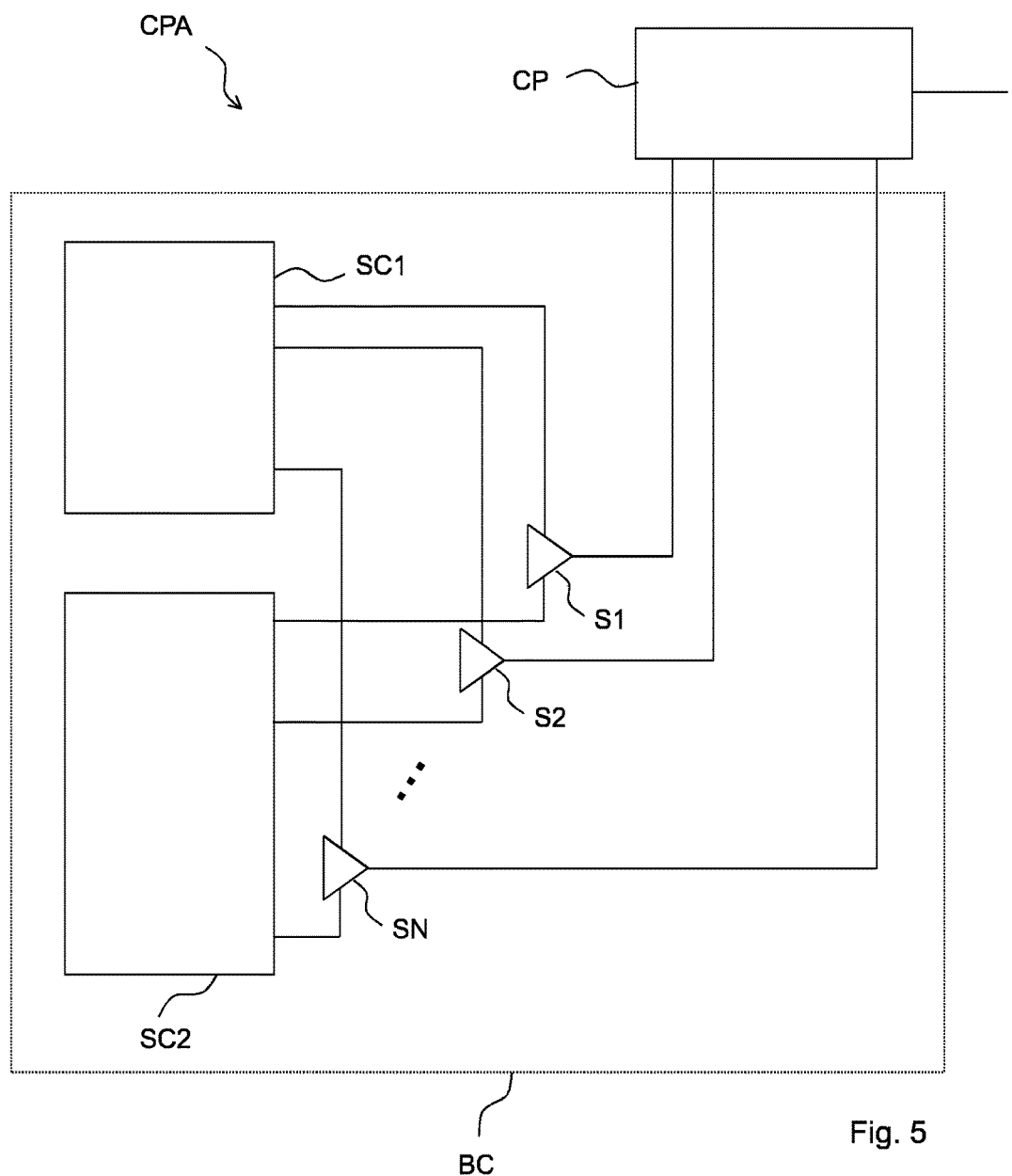
Figure 6:
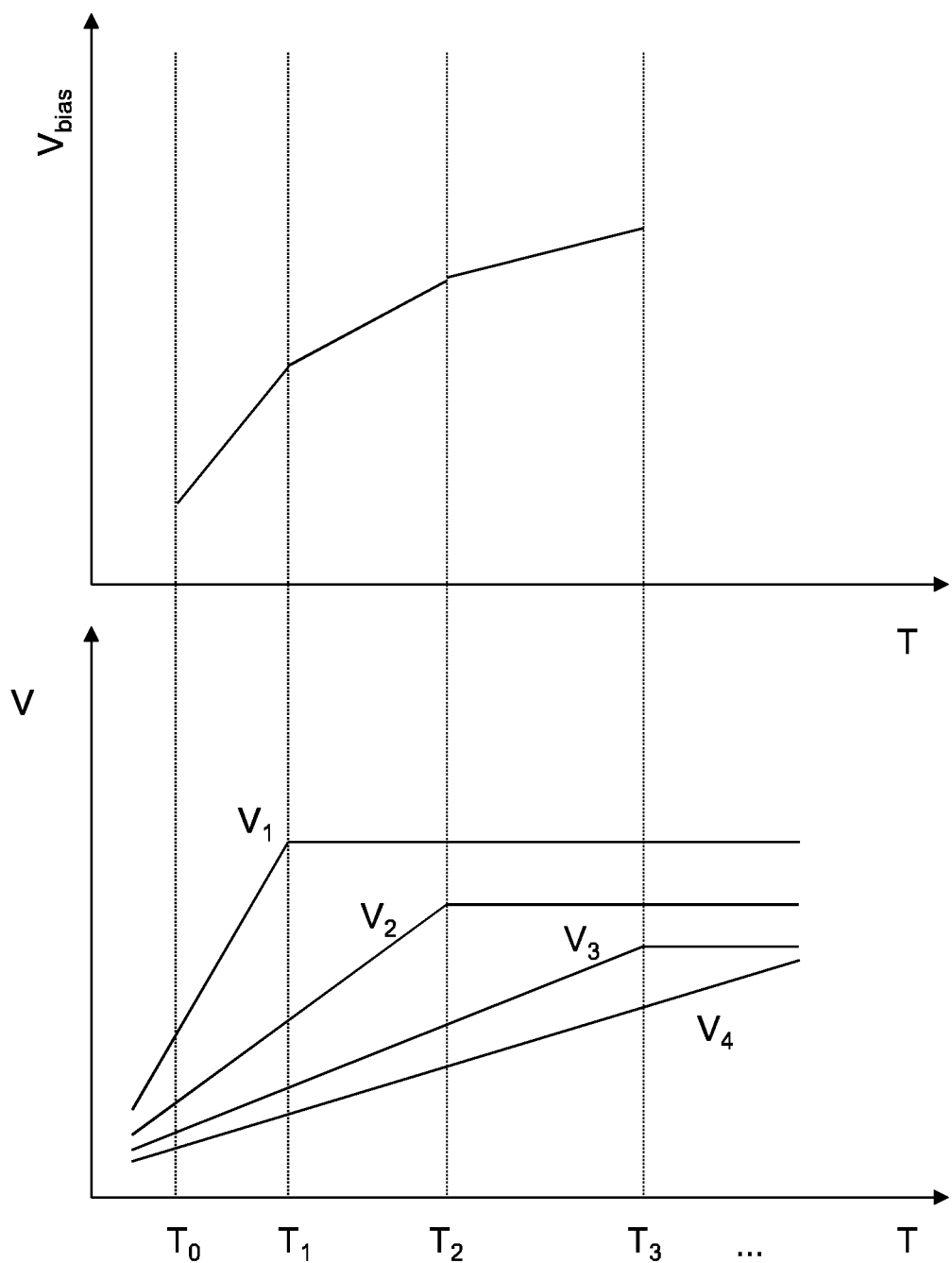
Figure 7:
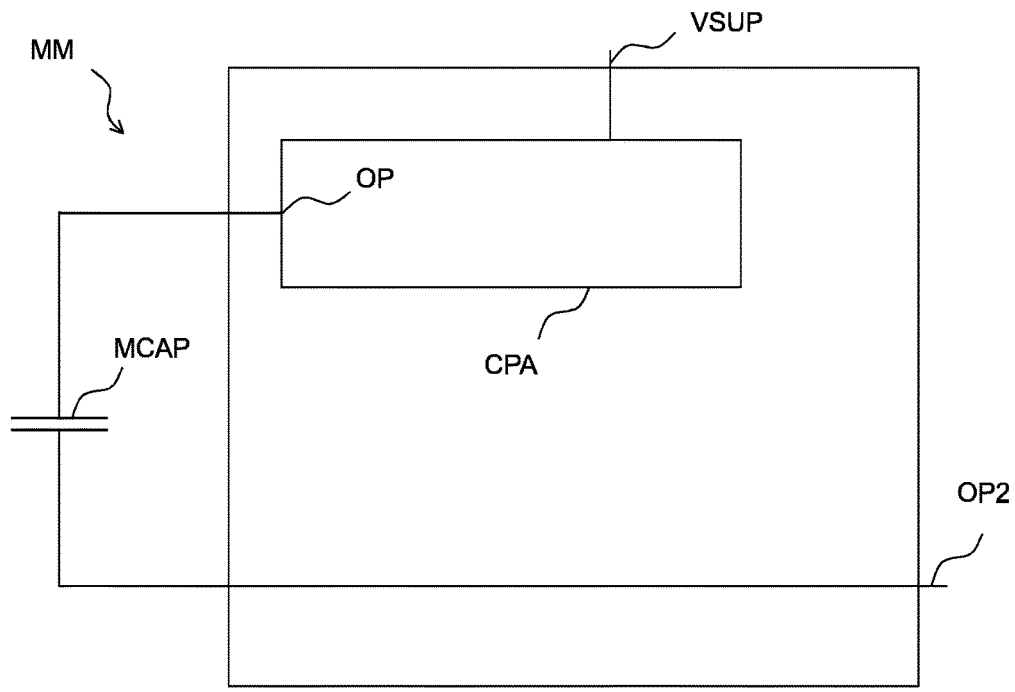
Figure 8:
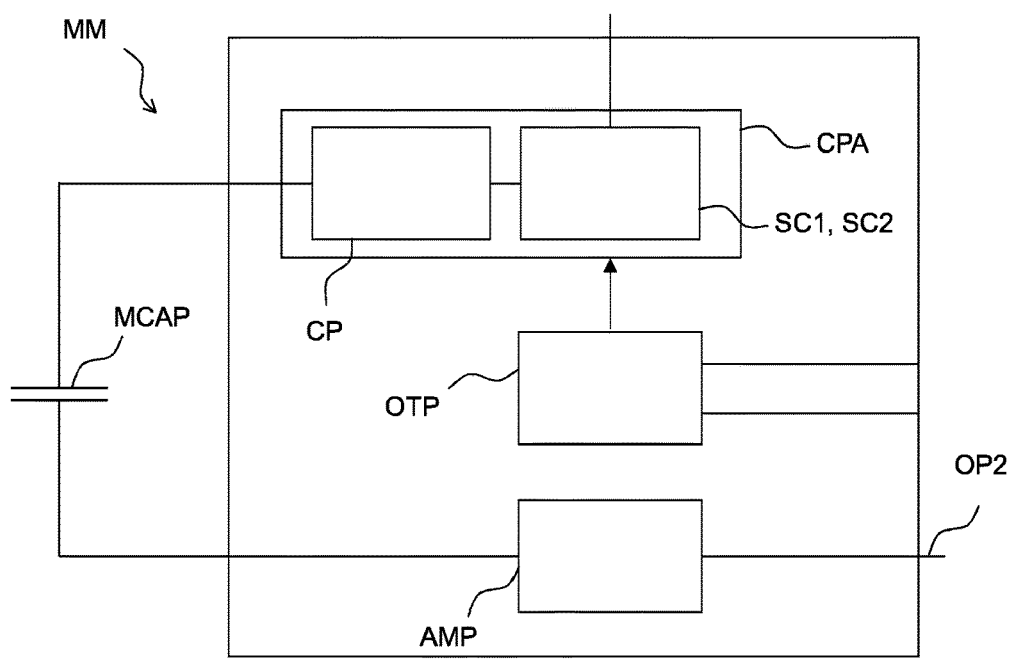

FIG. 1 shows a basic embodiment of a charge pump assembly CPA comprising a charge pump CP and a bias circuit BC, FIG. 2 shows an exemplary piecewise linear bias voltage provided to the charge pump, FIG. 3 shows an exemplary temperature dependent sensitivity with negative slope with decreasing absolute value and a corresponding piecewise linear approximation, FIG. 4 shows an exemplary temperature dependent sensitivity with negative slope with increasing absolute value and a corresponding piecewise linear approximation, FIG. 5 shows a more detailed embodiment of a charge pump assembly including a first sub circuit SC1 and a second sub circuit SC2 in the bias circuit BC, FIG. 6 shows the bias voltage as a composition a plurality of temperature dependent and temperature independent voltages together with the respective threshold temperatures $T_i$ voltages and threshold voltages $V_i$, FIG. 7 shows a basic embodiment of a MEMS microphone MM comprising the charge pump assembly CPA and a MEMS capacitor MCAP, FIG. 8 shows a more detailed embodiment of a MEMS microphone MM.

FIG. 1 a basic embodiment of a charge pump assembly CPA. The charge pump assembly CPA comprises a charge pump CP and a bias circuit BC. The charge pump CP comprises an input port IP with a plurality of signal connections. The plurality of signal connections provides a plurality of single voltage signals, the sum of which may be a bias voltage $V_{bias}$ controlling the charge pump CP. The charge pump CP further has an output port OP via which electric charge can be transferred, e.g. to a capacitor.

The bias voltage $V_{bias}$ provided by the bias circuit BC by providing a plurality of individual voltages has a temperature dependence. The temperature dependence of the bias voltage $V_{bias}$ is chosen such that the temperature dependence of the electrical charge provided at the output port OP by the charge pump CP counteracts a temperature-induced deterioration of the external circuit environment of the charge pump assembly CPA.

FIG. 2 shows a temperature-dependent bias voltage $V_{bias}$ applied from the bias circuit BC to the charge pump CP. In order to keep the complexity of the charge pump assembly's circuit components at a minimum, the bias voltage has piece-wise linear segments approximating the ideal bias voltage in great detail. The number of linear segments of the bias voltage determines the degree of approximation: a higher number of segments results in a better approximation.

FIGS. 3 and 4 show different temperature-dependent sensitivity curves of exemplary MEMS microphones. The temperature-dependent sensitivity of FIG. 3 decreases with increasing temperature. The slope is negative and the absolute value of the slope is reduced with increasing temperature. Temperatures $T_1, T_2, \ldots, T_N$ define threshold temperatures of adjacent temperature intervals. Within each temperature interval, the temperature-dependent sensitivity is approximated by a linear function. Accordingly, the absolute values of the approximating functions decrease with increasing temperature.

A designer of a charge pump assembly is free to choose the threshold temperatures $T_1, T_2, \ldots, T_N$ to obtain an optimal approximation.

In contrast to FIG. 3, the absolute value of the slope of the temperature-dependent sensitivity increases with increasing temperature.

As the designer is free to choose the threshold temperatures individually, he can divide temperature ranges with high absolute values of the sensitivity slope into a high number of intervals. In temperature ranges in which the sensitivity deterioration with temperature is not that much pronounced, a lower number of temperature intervals may be sufficient.

FIG. 5 shows a more detailed embodiment of the charge pump assembly CPA where the bias circuit BC comprises a first subcircuit SC1 and a second sub-circuit SC2. The first sub-circuit SC1 may provide a plurality of temperature-independent voltages and the second sub-circuit SC2 may provide a plurality of temperature-dependent voltages. The first sub-circuit SC1 may have a total number of N voltage outputs, the second sub-circuit SC2 may have a total number of N voltage outputs and the charge pump CP may have a total number of N voltage inputs at its input port. Further, the bias circuit BC comprises a total number of N selection circuits S1, S2, S . . . , SN, e.g. comparators, where each selection circuit is connected to one of the voltage outputs of the first sub-circuit SC1, to one voltage output of the second sub-circuit SC2, and to one voltage input of the charge pump CP. Depending on the actual operating temperature and the respective threshold temperatures $T_I$, each selection circuit forwards either the temperature-independent voltage from the first sub-circuit SC1 or the temperature-dependent voltage from the second sub-circuit SC2 to the respective voltage input at the charge pump CP.

Thus, the total bias voltage $V_{bias}$ applied to the charge pump is the sum of a plurality of temperature-dependent voltages and temperature-independent voltages from the first and the second sub-circuit, respectively. As a result, the total bias voltage applied to the charge-pump CP is a piece-wise linear voltage with a constant slope within each temperature interval (compare FIG. 6).

FIG. 6 illustrates the composition of the total bias voltage $V_{bias}$ (shown in the upper portion of FIG. 6) being composed of a plurality of individual voltages as shown in the lower portion of FIG. 6.

Temperatures $T_1, T_2, \ldots$ define threshold voltages establishing the boundaries of the corresponding temperature intervals. Each curve of the voltages shown in the lower portion of FIG. 6 is the result of the selectivity of a selection circuit selecting either a temperature-dependent voltage if the temperature is below a certain threshold voltage or selecting a constant voltage if the actual temperature exceeds the corresponding threshold temperature.

Thus, the number of circuit elements scales with the number of temperature intervals without increasing the complexity of the charge pump assembly circuitry.

As the sensitivity of a MEMS microphone is mainly proportional to the voltage applied to the corresponding MEMS capacitor and as the temperature-dependent sensitivity of the microphone can be easily and with high precision approximated by a piece-wise linear curve, it is easy to determine the co-efficients $a_i$ and $\alpha_i$ that determine the slope and the voltage of that of the corresponding segments of the piece-wise linear temperature-dependent bias voltage as shown in FIG. 6.

FIG. 7 shows a possible implementation of the charge pump assembly CPA in a MEMS microphone MM. Apart from the charge pump assembly CAP, the MEMS microphone MM comprises an MEMS capacitor MCAP with a variable capacitance and the essential connections, e.g. a voltage supply connection VSUP and a second output port OP2. Via the voltage supply port VSUP, the charge pump assembly CPA may be provided with electrical power. Via the second output port OP2, the variance in capacitance of the MEMS capacitor MCAP may be analyzed to transform an acoustic signal into an electrical signal.

FIG. 8 shows a more detailed version of the MEMS microphone MM where between the MEMS capacitor MCAP and the second output port OP2, a further amplifier circuit AMP is arranged. The further amplifier circuit AMP may be a pre-amplifier or a main amplifier.

The MEMS microphone MM further comprises circuitry OTP to provide the microphone with the corresponding values for parameters $a_i$ and $\alpha_i$, e.g. in a one-time programming step.

Neither the charge pump assembly nor an MEMS microphone comprising such a charge pump assembly are limited to the embodiments described below or shown in the figures. Charge pump assemblies with further circuit components or microphones with further circuit components or mechanical components are also comprised by the present invention.

LIST OF REFERENCE SIGNS

AMP: amplifier
BC: bias circuit
CP: charge pump
CPA: charge pump assembly
IP: input port
MCAP: MEMS capacitor
MM: MEMS microphone
OP: output port
OP2: second output port
OTP: one-time programming circuit
$S_1, S_2, \ldots, S_N$: selection circuits
SC1: first sub-circuit
SC2: second sub-circuit
T: temperature
$T_{1, 2, \ldots, N}$: threshold temperatures
$V_{1, 2, \ldots, N}$: threshold voltage
$V_{bias}$: bias voltage
$V_{SUP}$: supply voltage

The invention claimed is:
1. Charge pump assembly, comprising
a charge pump with an input port and an output port,
a bias circuit electrically connected to the input port and provided for creating a bias voltage $V_{bias}$,
where
the bias voltage $V_{bias}$ has a temperature dependence.
2. Charge pump assembly according to claim 1, where the bias voltage $V_{bias}$ has a piecewise linear temperature dependence.
3. Charge pump assembly according to claim 1, where the bias circuit comprises a temperature sensor.

4. Charge pump assembly according to claim 3, where the temperature sensor provides a Proportional To Absolute Temperature (PTAT) voltage.

5. Charge pump assembly according to claim 1, where the bias circuit comprises a first sub circuit providing a plurality of different temperature independent voltages.

6. Charge pump assembly according to claim 1, where the bias circuit comprises a second sub circuit providing a plurality of temperature dependent voltages, each temperature dependent voltage having a different temperature dependency.

7. Charge pump assembly according to claim 6, where the temperature dependent voltages have a linear temperature dependence.

8. Charge pump assembly according to claim 1, where the bias circuit comprises a plurality of selection circuits.

9. Charge pump assembly according to claim 8, where the selection circuits comprise comparators.

10. Charge pump assembly according to claim 1, where the bias circuit includes (i) a first sub circuit providing a plurality of different temperature independent voltages and (ii) a second sub circuit providing a plurality of temperature dependent voltages, each temperature dependent voltage having a different temperature dependency, and where the bias voltage is the sum of a plurality of voltages provided by the first sub circuit and the second sub circuit.

11. Charge pump assembly according to claim 1, further comprising a non-volatile memory element for storing linearity parameters.

12. Method for manufacturing a charge pump assembly according to claim 1, comprising the steps of:

providing mechanical and electrical components of the charge pump assembly according to claim 1, electrically connecting the electrical components, determining a temperature dependent deterioration of a sensitivity of a MEMS microphone over a temperature range, dividing the temperature range into intervals and approximating a curve of the sensitivity into a piecewise linear curve, determining slopes of the piecewise linear sections, transforming the slopes into parameters $a_i$, $\alpha_i$; and storing the parameters in a memory element.

13. Charge pump assembly according to claim 2, where the bias circuit comprises a first sub circuit providing a plurality of different temperature independent voltages.

14. Charge pump assembly according to claim 2, where the bias circuit comprises a second sub circuit providing a plurality of temperature dependent voltages, each temperature dependent voltage having a different temperature dependency.

15. Charge pump assembly according to claim 2, where the bias circuit comprises a temperature sensor that provides a Proportional To Absolute Temperature (PTAT) voltage, where the bias circuit comprises a first sub circuit providing a plurality of different temperature independent voltages, and where the bias circuit comprises a second sub circuit providing a plurality of temperature dependent voltages, each temperature dependent voltage having a different temperature dependency.

* * * * *